United States Patent
Shiraishi et al.

(10) Patent No.: US 10,153,217 B2
(45) Date of Patent: Dec. 11, 2018

(54) PLASMA PROCESSING APPARATUS AND PLASMA PROCESSING METHOD

(71) Applicant: HITACHI HIGH-TECHNOLOGIES CORPORATION, Minato-ku, Tokyo (JP)

(72) Inventors: Daisuke Shiraishi, Tokyo (JP); Akira Kagoshima, Tokyo (JP); Yuji Nagatani, Tokyo (JP); Satomi Inoue, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/437,026

(22) Filed: Feb. 20, 2017

(65) Prior Publication Data

US 2018/0068909 A1 Mar. 8, 2018

(30) Foreign Application Priority Data

Sep. 5, 2016 (JP) ................................. 2016-172381

(51) Int. Cl.
*H01L 21/00* (2006.01)
*H01J 37/32* (2006.01)
(Continued)

(52) U.S. Cl.
CPC ........ *H01L 22/26* (2013.01); *H01J 37/32082* (2013.01); *H01J 37/32935* (2013.01);
(Continued)

(58) Field of Classification Search
CPC ......... H01L 21/31116; H01L 21/67069; H01L 21/67253; H01L 22/26; H01L 22/14;
(Continued)

(56) References Cited

U.S. PATENT DOCUMENTS 5,759,424 A * 6/1998 Imatake ............ H01J 37/32935
156/345.24
6,297,163 B1 * 10/2001 Zhu ................... H01L 21/31116
257/E21.252

(Continued)

FOREIGN PATENT DOCUMENTS

JP 2005-347585 A 12/2005
JP 2010-199126 A 9/2010
(Continued)

OTHER PUBLICATIONS

Office Action dated Feb. 9, 2018 for Korean Patent Application No. 10-2017-0000136.

(Continued)

*Primary Examiner* — Nikolay Yushin
(74) *Attorney, Agent, or Firm* — Miles & Stockbridge P.C.

(57) ABSTRACT

A plasma processing apparatus including a processing chamber, a radio frequency power source, a monitoring unit, and a calculation unit is provided. In the processing chamber, etching target film is etched by using plasma. The radio frequency power source supplies radio frequency electric power. The monitoring unit monitors light emission of the plasma. The calculation unit estimates an etching amount of plasma etching of the etching target film based on an emission intensity and a correlation between the etching amount of the etching target film and the emission intensity, the emission intensity being obtained when removing, by using the plasma, a deposition film deposited as a result of the plasma etching.

7 Claims, 8 Drawing Sheets

(51) Int. Cl.
*H01L 21/66* (2006.01)
*H01L 21/311* (2006.01)
*H01L 21/67* (2006.01)

(52) U.S. Cl.
CPC .. *H01J 37/32972* (2013.01); *H01L 21/31116* (2013.01); *H01L 21/67069* (2013.01); *H01L 21/67253* (2013.01); *H01J 2237/334* (2013.01)

(58) Field of Classification Search
CPC ............. H01J 37/32082; H01J 37/3293; H01J 2237/334; H01J 37/32935; H01J 37/32926; H01J 2237/33
See application file for complete search history.

(56) References Cited

U.S. PATENT DOCUMENTS

| | | | | |
|---|---|---|---|---|
| 6,551,445 | B1* | 4/2003 | Yokogawa | ........ H01J 37/32623 118/723 E |
| 6,731,008 | B1* | 5/2004 | Tomita | .............. H01L 21/76897 257/296 |
| 7,906,434 | B2* | 3/2011 | Hashimoto | .......... H01L 21/0332 257/E21.312 |
| 8,992,721 | B2* | 3/2015 | Kagoshima | ....... H01J 37/32926 118/712 |
| 2010/0041235 | A1* | 2/2010 | Hashimoto | .......... H01L 21/0332 438/703 |
| 2010/0178415 | A1 | 7/2010 | Nishimori et al. | |
| 2011/0083808 | A1* | 4/2011 | Kagoshima | ....... H01J 37/32926 156/345.24 |

FOREIGN PATENT DOCUMENTS

JP 2014-220360 A 11/2014
KR 10-2010-0083670 A 7/2010

OTHER PUBLICATIONS

Korean Office Action dated Sep. 11, 2018 for Application No. 10-2017-0000136 with a machine English translation.

* cited by examiner

FIG. 8

PLASMA PROCESSING APPARATUS AND PLASMA PROCESSING METHOD

BACKGROUND OF THE INVENTION

1. Field of the Invention

The present invention relates to a plasma processing apparatus and a plasma processing method, specifically to a plasma processing apparatus and a plasma processing method suitable for a process of stopping etching at a predetermined depth.

2. Description of the Related Art

In the case of stopping etching of an etching target material at a predetermined depth that is halfway in the depth direction, a technique of determining an ending point of the etching by using change in emission intensity in plasma etching is not applicable because an etching stopper film that is of a material different from the etching target material is not present. Therefore, as a technique applicable to such a case, a technique of determining the ending point of the etching by calculating a depth of a groove by using interference with light reflected from an etching surface is known.

However, some etching target material has a nature that transmits light and thus is not suitable for using interference light. In such a case, a relationship between processing time and etching depth is derived in advance, and the etching depth is indirectly managed by using the processing time of etching. In the management using time as described above, temporal change may occur in repetition of etching processing, and thus variation of wafers may occur in a lot or between lots. Therefore, in order to suppress the temporal change of the etching process and make plasma processing more stable, stabilizing processing called as aging or seasoning is performed before the etching processing and cleaning processing is performed after the etching processing.

As a conventional processing apparatus that performs such processing, JP 2005-347585 A discloses a processing apparatus that suppresses, in trench etching processing performed in manufacture of a semiconductor device, variation of groove depth required in trench etching by deriving an amount of groove depth variation resulting from a density of etching target pattern in an etching processing target wafer and a temporal variation amount of the groove depth and by calculating etching time for correcting these variations. The temporal variation of the groove depth is caused by the etching apparatus/chamber and calculated from past groove depth data and set etching time data.

SUMMARY OF THE INVENTION

Regarding the temporal variation in the etching not using the etching stopper film described above, the etching depth may sometimes vary in accordance with the amount of deposition of reaction product on the inner wall of the processing chamber. The state of etching when such phenomenon occurs will be described with reference to FIGS. 7A and 7B.

Figure 7A:
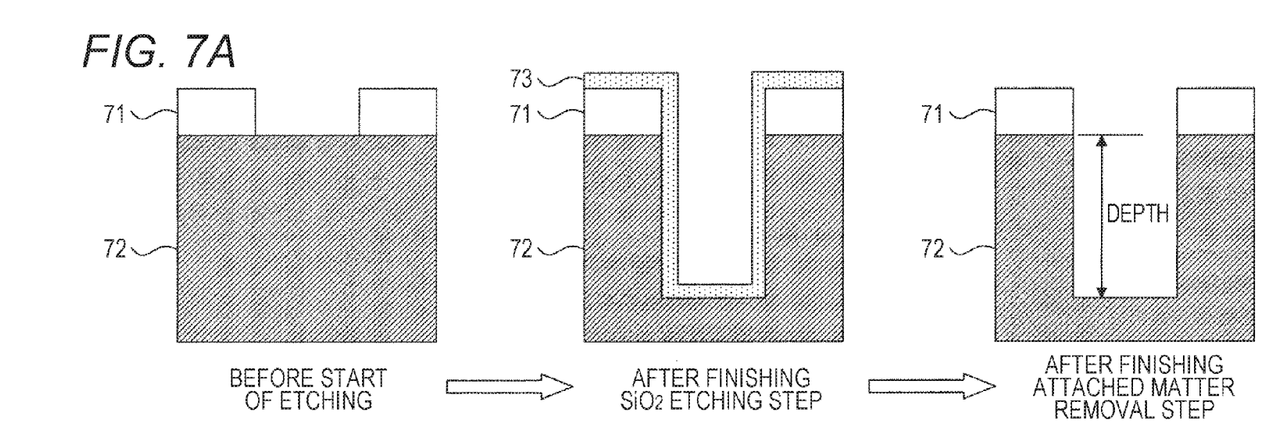
FIGS. 7A and 7B illustrate relationships between etching depth and thickness of attached matter.
Figure 7B:
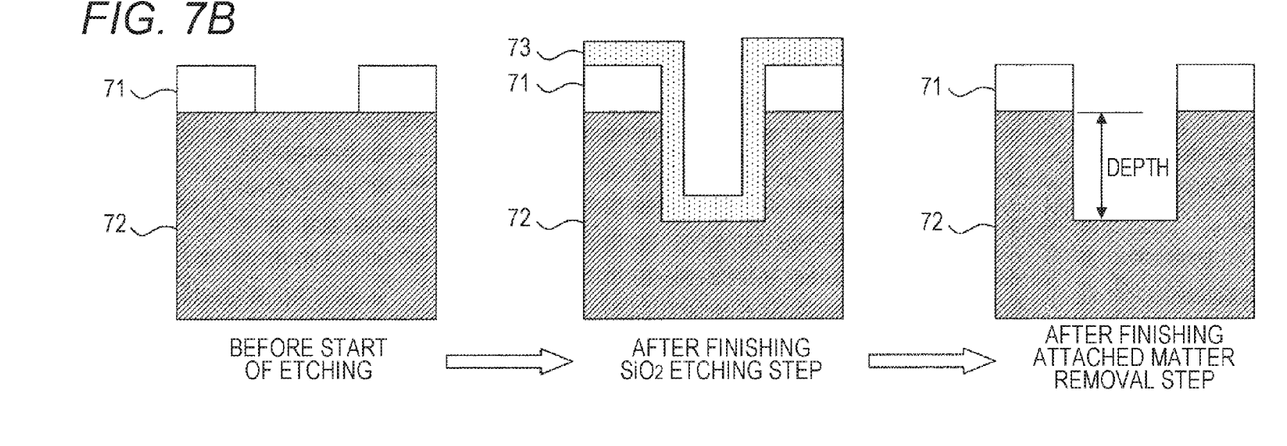

FIG. 7A illustrates a shape of a wafer in section in the case where etching is performed with a large etching depth. FIG. 7B illustrates a shape of a wafer in section in the case where etching is performed with a small etching depth. In the case of performing etching of such a film structure, it is difficult to perform end point determination using light emission of plasma because a base film (stopper film of an etching target film 72) is not present under an etching target film 72. Therefore, etching processing of the etching target film 72 is performed in a predetermined time. In such etching processing, the etching depth may vary depending on, for example, the temperature of, the degree of wear of, the type of matter attached to, and the amount of matter attached to the inner wall of the processing chamber.

Such situation occurs in the case where, for example, in a film structure including a silicon nitride ($Si_3N_4$) film or the like as a masking film 71 and a silicon oxide ($SiO_2$) film or the like as the etching target film 72, the etching target film 72 is etched using a fluorocarbon gas (such as $CF_4$ gas) or a gas system including a hydrocarbon gas (such as $CH_4$ gas) added to a fluorine-containing gas (such as $SF_6$ gas and $NF_3$ gas). Etching of the etching target film 72 ($SiO_2$) proceeds by generating $SiF_4$ from reaction with a fluorine-containing gas.

However, when the film structure and the gas system described above are used, carbon-based attached matter 73 attaches onto the wafer after etching the etching target film 72 as illustrated in FIGS. 7A and 7B. After that, the attached matter 73 is removed by using a gas system including an oxygen-based gas (such as $O_2$), and the etching processing is finished. The attached matter 73 also deposits on the inner wall of the processing chamber simultaneously. In the case where a large amount of the attached matter 73 is deposited on the inner wall of the processing chamber, the amount of the attached matter 73 deposited on the wafer becomes small. Conversely, in the case where a small amount of the attached matter 73 is deposited on the inner wall of the processing chamber, the amount of the attached matter 73 deposited on the wafer becomes large. As described above, the thickness of the attached matter 73 deposited on the wafer changes momentarily in accordance with the state of the inner wall of the processing chamber.

Figure 8:
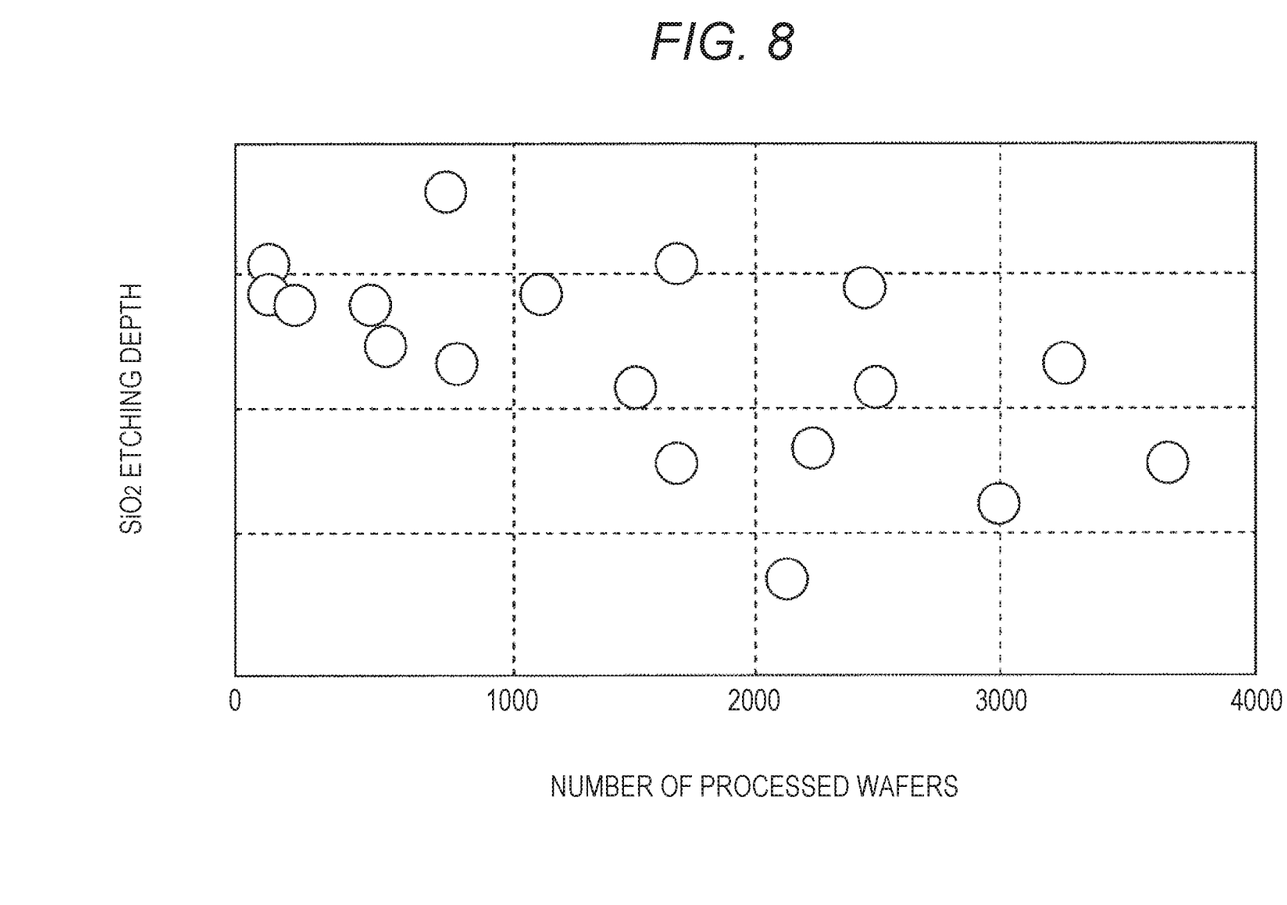
FIG. 8 is a graph illustrating the variation of etching depth occurring when wafers illustrated in FIGS. 7A and 7B are processed.

The attached matter 73 deposited on the wafer hinders etching reaction of the etching target film 72. Therefore, in the case where the amount of deposition of the attached matter 73 is small as illustrated in FIG. 7A, the etching depth of the etching target film 72 becomes large, and, in the case where the amount of deposition of the attached matter 73 is large as illustrated in FIG. 7B, the etching depth of the etching target film 72 becomes small. FIG. 8 is a graph that illustrates the variation of etching depth when a plasma etching apparatus processes the semiconductor wafer illustrated in FIGS. 7A and 7B. As illustrated in FIG. 8, the etching depth changes as more wafers are processed.

In spite of this, in the conventional technique, stability of etching depth between samples has not been sufficiently considered. That is, what detection data should be obtained from an information sensor to correct the processing condition in the case where the etching depth varies between samples when processing plural samples has not been suggested. In addition, data of pro-lot stabilizing processing before lot processing that the conventional technique utilizes is not suitable as data for deriving the condition of etching depth of each single sample.

Further, in the conventional technique disclosed in JP 2005-347585 A, stability of etching processing is not considered. That is, the variation of etching depth is reduced by changing the etching time, in other words, by changing the etching state. This can be considered insufficient in terms of stabilization of etching processing.

Therefore, an aspect of the present invention provides a plasma processing apparatus and a plasma processing method that performs etching processing of forming a groove and a hole of a predetermined depth on plural samples stably and suppresses the variation of etching depth.

An aspect of the present invention provides a plasma processing apparatus including a processing chamber, a radio frequency power source, a monitoring unit, and a calculation unit. In the processing chamber, etching target film is etched by using plasma. The radio frequency power source supplies radio frequency electric power for generating the plasma. The monitoring unit monitors light emission of the plasma. The calculation unit estimates an etching amount of plasma etching of the etching target film based on an emission intensity and a correlation between the etching amount of the etching target film and the emission intensity, the emission intensity being obtained when removing, by using the plasma, a deposition film deposited as a result of the plasma etching, the correlation being obtained in advance.

Another aspect of the present invention provides a plasma processing method of etching an etching target film by using plasma. The plasma processing method includes monitoring an emission intensity when removing, by using the plasma, a deposition film deposited as a result of plasma etching of the etching target film, and estimating an etching amount of the plasma etching based on the monitored emission intensity and a correlation between the etching amount of the etching target film and the emission intensity, the correlation being obtained in advance.

An aspect of the present invention performs etching processing of forming a groove and a hole of a predetermined depth on plural samples stably and suppresses the variation of etching depth.

DESCRIPTION OF THE PREFERRED EMBODIMENTS

Figure 4:
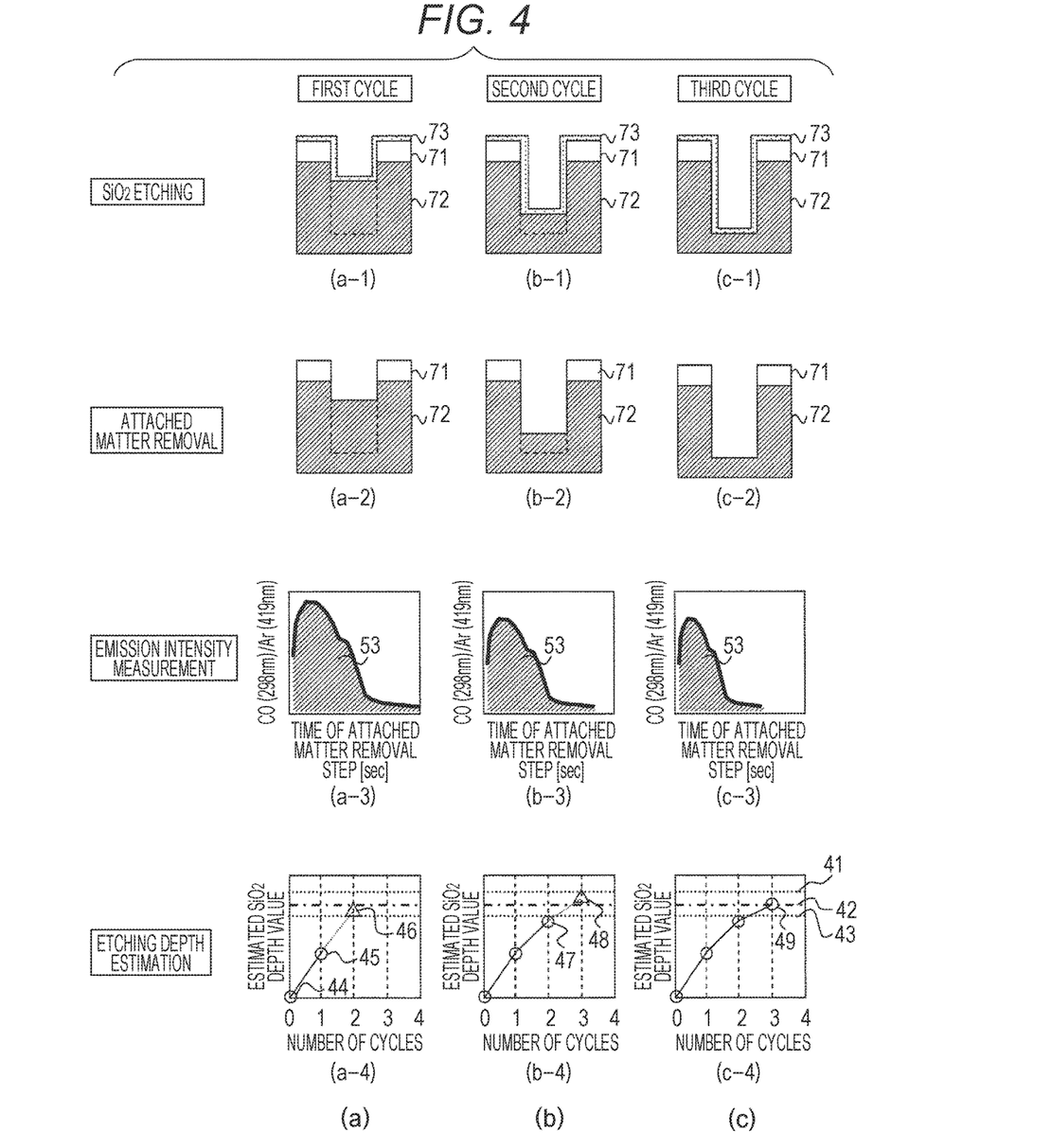
FIG. 4 is a schematic diagram that supplements a description of the flowchart illustrated in FIG. 3.

An exemplary embodiment of the present invention relates to a plasma processing apparatus that, in cycle etching performed by repeating an etching step as illustrated in FIG. 4 that will be described later, suppresses the variation of etching depth by finishing etching processing on the basis of an etching depth estimated by using an emission intensity obtained when removing a deposition film deposited during each cycle of the cycle etching. The exemplary embodiment will be described with reference to drawings.

Figure 1:
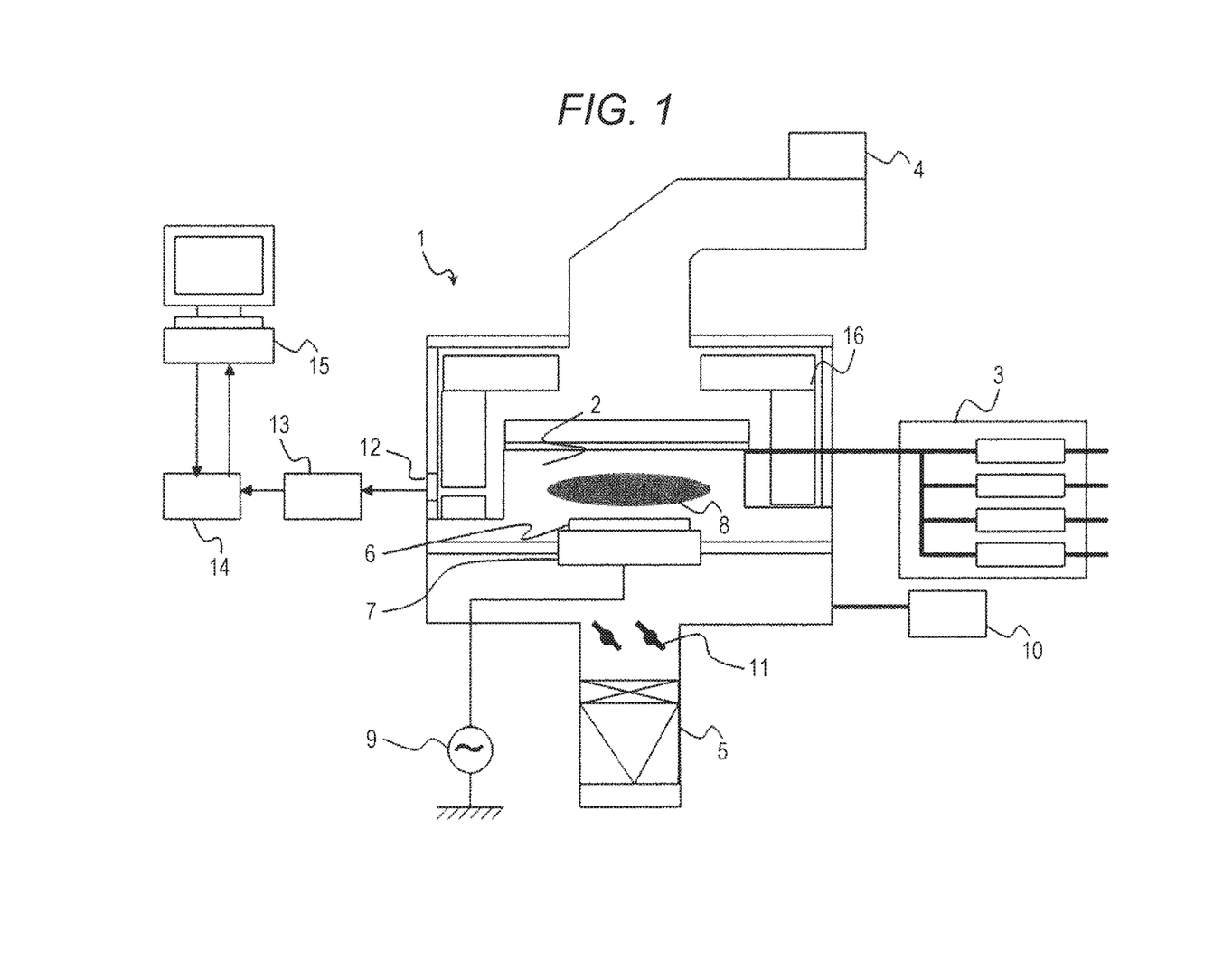
FIG. 1 is a diagram schematically illustrating a configuration of a plasma etching apparatus according to an exemplary embodiment of the present invention.

FIG. 1 is a schematic diagram schematically illustrating a configuration of a plasma etching apparatus 1 according to the exemplary embodiment of the present invention. The plasma processing apparatus 1 of the present exemplary embodiment includes a processing chamber 2, a mass flow controller 3, a plasma generating radio frequency power source 4, and an exhaustion apparatus 5. Plasma processing is performed in the processing chamber 2. The mass flow controller 3 adjusts the amount and speed of a processing gas supplied to the processing chamber 2. The plasma generating radio frequency power source 4 supplies radio frequency electric power for exciting the processing gas supplied to the processing chamber 2 to generate plasma. The exhaustion apparatus 5 includes a vacuum pump that exhausts the gas from the processing chamber 2. In addition, a sample table 7 that supports a wafer 6, which is a processing target sample and is disposed on the top surface of the sample table 7, is disposed below a space in which the plasma is generated in the processing chamber 2.

The processing gas used for the etching processing is supplied to the processing chamber 2 through the mass flow controller 3. Further, the processing gas is introduced from an upper portion of the processing chamber 2 by a conveyance member such as a waveguide disposed in an upper portion of the processing chamber 2, particles of the processing gas are excited as a result of interaction between radio frequency electric power of a certain frequency (for example, 2.45 GHz) supplied by the plasma generating radio frequency power source 4 and a magnetic field generated in the processing chamber 2 by a magnetic field generation unit 16 disposed in an upper portion and on the side circumference of the processing chamber 2 so as to surround the processing chamber 2, and plasma 8 is thus generated.

A bias electric field is generated above the sample table 7 or the top surface of the wafer 6 supported on a placing surface of the top surface of the sample table 7 by radio frequency electric power supplied by a bias radio frequency power source 9 connected to an electrode formed of conductor disposed in the sample table 7. Charged particles (ions) in the plasma 8 are attracted by the generated bias electric field and collide with a thin film that is already formed and disposed on the surface of the wafer 6. As a result of this, the surface of the wafer 6 is activated, chemical and physical interaction between reactive particles in the plasma 8 and a material constituting the film is promoted, and etching processing of a target film proceeds.

The pressure inside the processing chamber 2 is kept at a pressure appropriate for processing by comparing a value measured by a pressure meter 10 with a standard value and adjusting, on the basis of the result of the comparison, the rotation angle of a variable conductance valve 11 to adjust the speed of exhaustion. The variable conductance valve 11 is a valve including plural plates that variably adjust, by rotating about a shaft disposed in the horizontal direction, the size of an opening in a path connecting the inside of the processing chamber 2 with the exhaustion apparatus 5.

Light emission of the plasma 8 generated during the plasma processing is observed by a light receiver 13 serving as a monitor through an observation window 12 formed of a light-transmissive material and disposed in a wall member of a side wall of the processing chamber 2, and the intensity thereof is thus detected. The signal related to the emission intensity of the plasma 8 detected by the light receiver 13 is transmitted to a calculation unit 14 that is disposed so as to be communicable therewith, and the calculation unit 14 calculates or detects a certain amount from the received signal. The calculation unit 14 determines whether or not to continue the etching processing by using the detected emission intensity of the plasma 8, calculates a next etching time, and transmits the results of the determination and the calculation to a control unit 15.

The control unit 15 is connected with, for example, the mass flow controller 3 of the plasma processing apparatus 1, the exhaustion apparatus 5, the plasma generating radio frequency power source 4, the magnetic field generation unit 16, the bias radio frequency power source 9, the pressure meter 10, a rotational driving device of the variable conductance valve 11, and so forth via a communication unit, receives signals transmitted from these components, and transmits signals of commands of necessary operations to these components to control operations of these components.

The control unit 15 according to the present exemplary embodiment performs control for plasma processing of the case where etching is performed on the etching target film 72 disposed under the masking film 71 serving as a mask as illustrated in FIG. 4 such that the etching target film 72 is etched to a predetermined depth. More specifically, the control unit 15 performs control to suppress the variation of the etching depth by processing a single wafer 6 in a process of plural cycles, each cycle including an etching step and an attached matter removal step, and estimating the etching depth for each cycle to change the plasma processing condition. The configuration of the calculation unit 14 will be described next.

Figure 2:
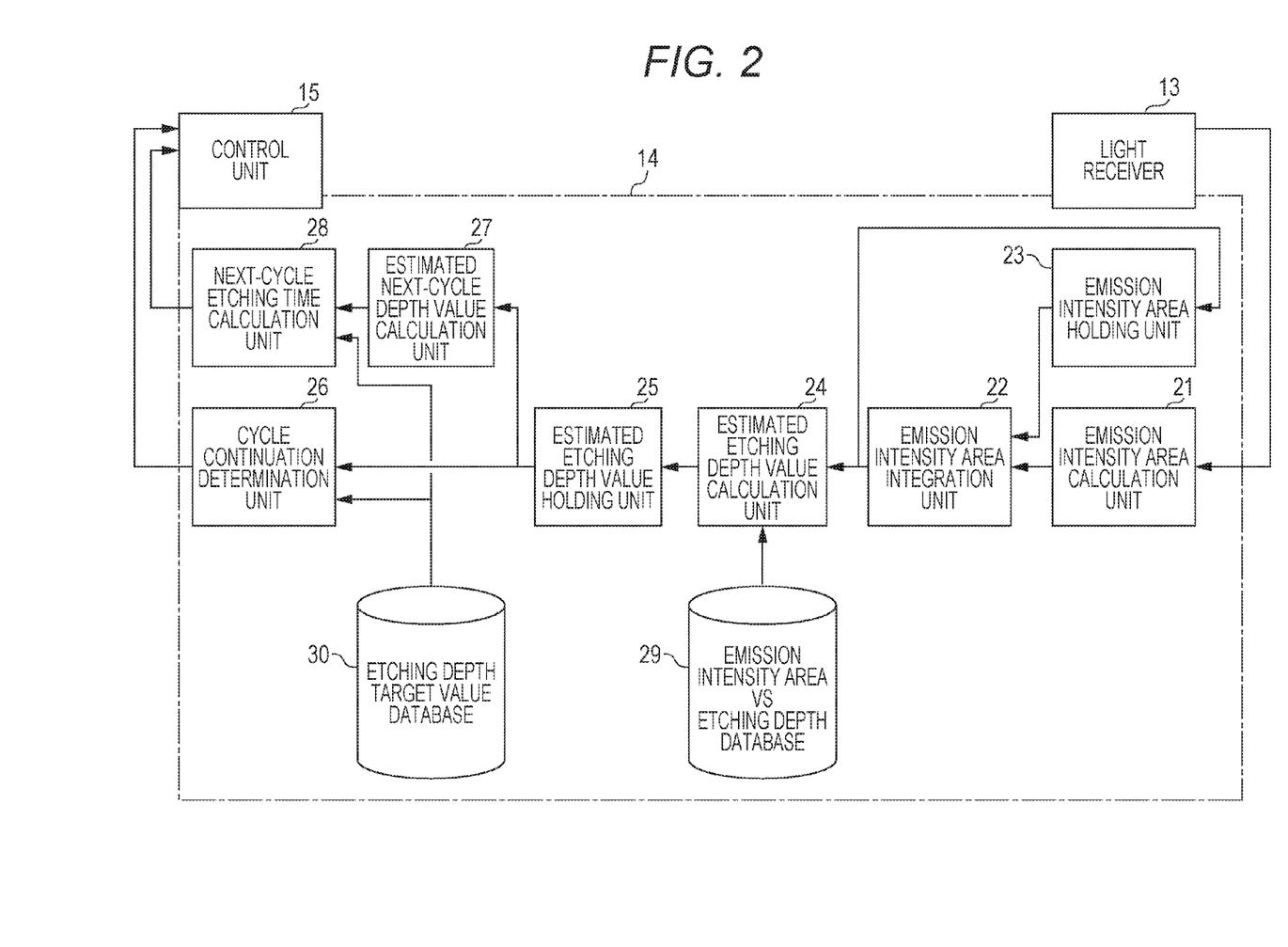
FIG. 2 is a schematic diagram illustrating a configuration of a calculation unit.

FIG. 2 is a schematic diagram illustrating a configuration of the calculation unit 14. In the present exemplary embodiment, a signal related to an emission intensity of the plasma 8 is transmitted from the light receiver 13 to an emission intensity area calculation unit 21 in the calculation unit 14 every predetermined sampling time In an etching step of removing the attached matter 73, which is a deposition film, on the basis of the value of emission intensity transmitted from the light receiver 13, the emission intensity area calculation unit 21 extracts a trend (such as a ratio of CO (298 nm) to Ar (419 nm)) of wavelength representing the removal of the attached matter 73, and calculates an emission intensity area 53 of that time. The calculated emission intensity area 53 is transmitted to an emission intensity area integration unit 22. The emission intensity area 53 is an emission intensity area 53 illustrated in FIG. 4 that will be described later.

The emission intensity area integration unit 22 integrates the value of emission intensity area 53 transmitted from the emission intensity area calculation unit 21 and a value of emission intensity area 53 calculated while processing the wafer 6 on the basis of an integrated value of emission intensity area transmitted from an emission intensity area holding unit 23 that will be described later. The integrated value of emission intensity area obtained by the emission intensity area integration unit 22 is transmitted to the emission intensity area holding unit 23 and an estimated etching depth value calculation unit 24.

The emission intensity area holding unit 23 holds the integrated value of emission intensity area transmitted from the emission intensity area integration unit 22. The integrated value of emission intensity area that is held is transmitted to the emission intensity area integration unit 22 and used for calculation of the integrated value of emission intensity area of the next etching cycle. The value held in the emission intensity area holding unit 23 is initialized at the start of etching processing.

The estimated etching depth value calculation unit 24 calculates an estimated etching depth value by using the integrated value of emission intensity area transmitted from the emission intensity area integration unit 22 and information stored in an emission intensity area/etching depth database 29, and transmits the estimated etching depth value that has been calculated to an estimated etching depth value holding unit 25. The emission intensity area/etching depth database 29 stores correlation data of the emission intensity area and the etching depth. Next, the emission intensity area/etching depth database 29 will be described in detail.

The emission intensity area/etching depth database 29 is constituted by at least four items of recipe No., wafer product information, emission intensity area, and etching depth. Each recipe No. is associated with plural pieces of wafer product information. The emission intensity area used herein corresponds to the integrated value of emission intensity area integrated for each etching cycle. Each piece of wafer product information is associated with plural emission intensity areas and etching depths.

Figure 6:
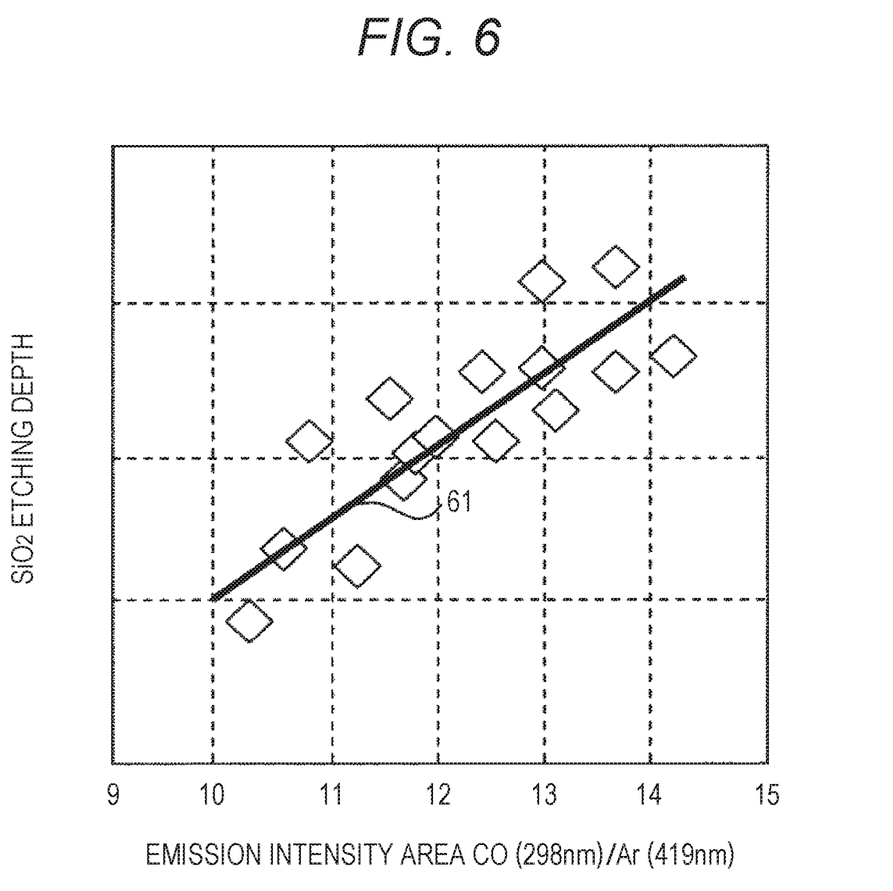
FIG. 6 is a diagram illustrating a correlation between emission intensity area (CO/Ar) and etching depth.

The field of emission intensity area and etching depth of each piece of wafer product information stores values of emission intensity area and etching depth illustrated in FIG. 6. These values require to be obtained in advance via experiments or the like. Storing these values for each wafer product reveals the relationship of each wafer product between the emission intensity area and the etching depth and enables calculating the estimated value of etching depth from the value of emission intensity obtained by the light receiver 13.

The values of emission intensity area and etching depth may be directly stored in the emission intensity area/etching depth database 29. However, since the values of emission intensity area and etching depth can include a measurement error, a line 61 or a curve may be calculated for noise removal by approximation of a correlation graph (FIG. 6) of etching depth and emission intensity area, and values of emission intensity area and etching depth corresponding to the line 61 or the curve may be stored.

An etching depth target value database 30 is constituted by at least recipe No., wafer product information, and etching depth target value. Etching depth target lower limit value and etching depth target upper limit value may be added depending on the purpose. Each recipe No. is associated with plural pieces of wafer product information. Each piece of wafer product information is associated with at least one etching depth target value, and the etching depth most suitable for a wafer 6 for each product device is stored as the etching depth target value.

These enable comparison between an estimated etching depth value and an etching depth target value, and thus enable determination of whether or not to continue the etching cycle and calculation of etching time of the next cycle. In addition, whether or not to continue the etching cycle may be determined on the basis of an etching depth target lower limit value and an etching depth target upper limit value, and a function of outputting an error alert when the estimated etching depth value exceeds the upper limit value or the lower limit value may be added.

The estimated etching depth value holding unit 25 holds the estimated etching depth value transmitted from the estimated etching depth value calculation unit 24 during the processing of the wafer 6. While processing one wafer 6, the estimated etching depth value is calculated plural times, and the estimated etching depth value holding unit 25 holds the plurality of estimated etching depth values while processing the one wafer 6. The estimated etching depth value holding unit 25 transmits the estimated etching depth values that are held to a cycle continuation determination unit 26 and an estimated next-cycle etching depth value calculation unit 27.

The cycle continuation determination unit 26 determines whether or not to continue the etching cycle (the etching step and the attached matter removal step) by using the estimated etching depth values transmitted from the estimated etching depth value holding unit 25 and information stored in the etching depth target value database 30, and transmits the result of the determination to the control unit 15. In the case where the cycle continuation determination unit 26 determines to continue the cycle, the control unit 15 continues the etching cycle. In the case where the cycle continuation determination unit 26 determines to stop the cycle, the control unit 15 finishes the etching processing.

The estimated next-cycle etching depth value calculation unit 27 estimates the etching depth of the next cycle by applying a linear approximation expression or a logarithmic approximation expression to the estimated etching depth values transmitted from the estimated etching depth value holding unit 25. The estimated next-cycle etching depth value calculation unit 27 transmits the estimated etching depth value of the next cycle to a next-cycle etching time calculation unit 28.

The next-cycle etching time calculation unit 28 calculates the etching time of the next cycle by using the estimated etching depth value of the next cycle transmitted from the estimated next-cycle etching depth value calculation unit 27 and the information stored in the etching depth target value database 30, and transmits the calculated etching time to the control unit 15. The control unit 15 derives the etching time of the next cycle on the basis of the etching time transmitted from the next-cycle etching time calculation unit 28. The plasma processing according to the present invention will be described next with reference to a flowchart illustrated in FIG. 3.

Figure 3:
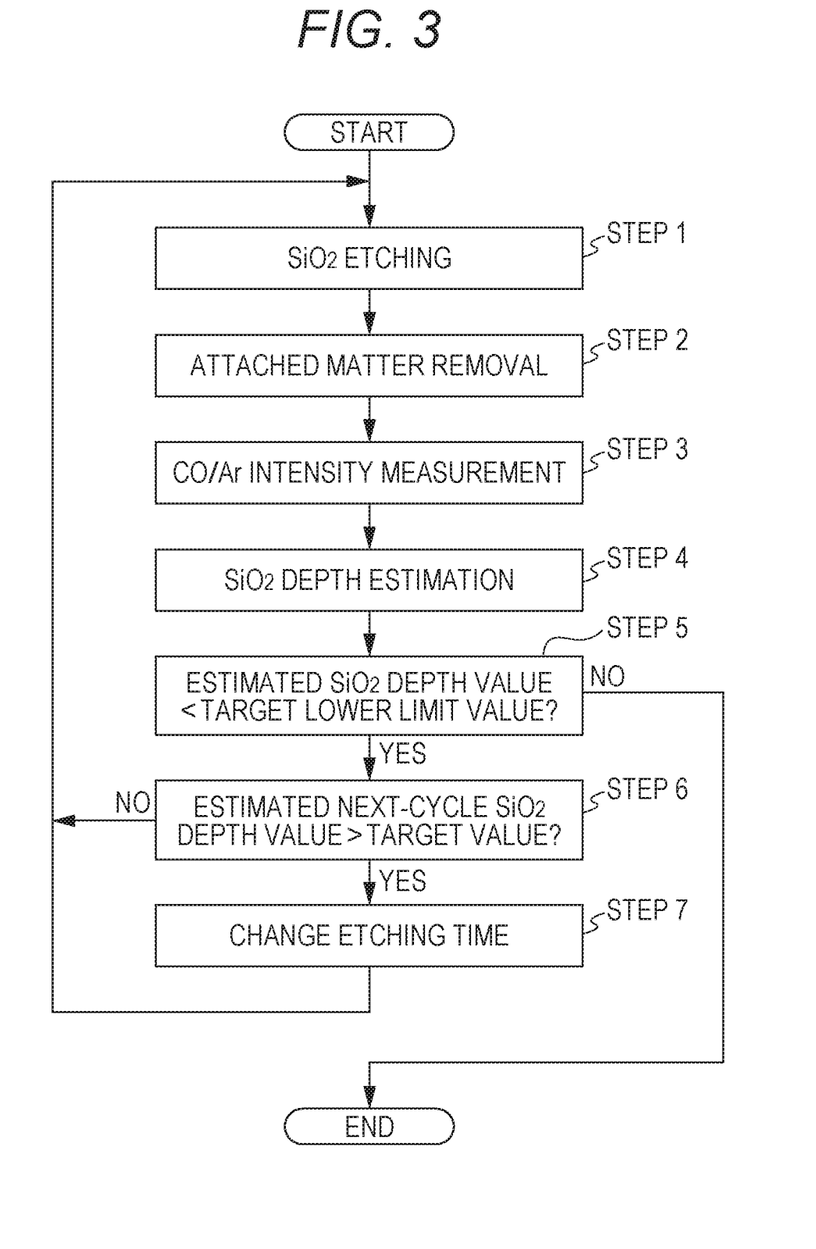
FIG. 3 is a flowchart according to the exemplary embodiment of the present invention.

FIG. 3 illustrates a process constituted by seven steps from step 1 to step 7. Steps 1 to 7, steps 1 to 6, or steps 1 to 5 are referred to as one etching cycle. The etching processing of one wafer 6 is performed in plural etching cycles. The process flow of the first etching cycle will be described below with reference to the flowchart illustrated in FIG. 3.

The wafer 6 is transported by a transportation robot (not illustrated), placed on the sample table 7, and kept on the sample table 7. After that, the processing chamber 2 is sealed to be airtight, and the processing gas is supplied to the processing chamber 2 by the mass flow controller 3. Then, plasma is generated in the processing chamber 2, and etching processing is started by setting the film structure on the wafer 6 illustrated in FIG. 7 as an etching target. In step 1, the control unit 15 sends out a command and information, and the etching processing is started by using a predetermined processing condition by setting the etching target film 72 as the etching target. The etching processing is continued for a predetermined period of time, and then finished. Part (a-1) of FIG. 4 illustrates the film structure of the wafer 6 in section after step 1 is finished. In part (a-1) of FIG. 4, the etching target film 72 is etched, and the attached matter 73 covers the masking film 71 and the etching target film 72.

Here, FIG. 4 illustrates etching of $SiO_2$, attached matter removal, emission intensity measurement, and etching depth estimation. Step 1 of FIG. 3 corresponds to the etching of $SiO_2$ of FIG. 4, step 2 of FIG. 3 corresponds to the attached matter removal of FIG. 4, step 3 of FIG. 3 corresponds to the emission intensity measurement of FIG. 4, and steps 4 to 7 of FIG. 3 correspond to the etching depth estimation of FIG.

4. As described above, the etching processing of the one wafer 6 is performed in plural etching cycles. FIG. 4 illustrates an exemplary case where the etching processing is performed in three etching cycles.

Next, in step 2, the control unit 15 sends out a command and information, and attached matter removal processing is started by using a predetermined processing condition for removing the attached matter 73. The attached matter removal processing is continued for a predetermined period of time, and then finished. Part (a-2) of FIG. 4 illustrates the film structure of the wafer 6 in section after step 2 is finished. In this part, the attached matter 73 that has covered the masking film 71 and the etching target film 72 is removed.

Next, in step 3, measurement of emission intensity obtained during the attached matter removal processing performed in step 2 is performed. The emission intensity area calculation unit 21 extracts, from emission intensities transmitted from the light receiver 13, an intensity trend (a ratio of CO (298 nm) to Ar (419 nm)) of the wavelength representing the removal of the attached matter 73 in the attached matter removal processing of step 2. Part (a-3) of FIG. 4 illustrates the extracted intensity trend of wavelength. An emission intensity area 53 is calculated on the basis of the extracted intensity trend of wavelength. The calculated emission intensity area 53 is transmitted to the emission intensity area integration unit 22. Step 3 used herein is denoted with the numeral of 3 for the sake of convenience in description. However, step 3 is actually not performed after step 2 but is performed at the same time as step 2.

The emission intensity area integration unit 22 integrates the emission intensity area 53 of the current etching cycle and the integrated value of emission intensity areas of the past etching cycles. However, in the first etching cycle, since the emission intensity areas of the past etching cycles are not present, the emission intensity area 53 of the first etching cycle is used as the integrated value of emission intensity area as it is. The integrated value of emission intensity area is transmitted to the emission intensity area holding unit 23 and the estimated etching depth value calculation unit 24.

Next, in step 4, etching depth estimation processing is performed. In step 4, the estimated etching depth value calculation unit 24 calculates an estimated etching depth value by using the integrated value of emission intensity area transmitted from the emission intensity area integration unit 22 and the information stored in an emission intensity area/etching depth database 29, and transmits the estimated etching depth value that has been calculated to the estimated etching depth value holding unit 25.

The estimated etching depth value that has been calculated is held by the estimated etching depth value holding unit 25. Part (a-4) of FIG. 4 schematically illustrates the case where the estimated etching depth value is held. In part (a-4) of FIG. 4, a plotted point 44 represents an etching depth before the etching processing. Therefore, a 0 value is plotted as the plotted point 44. The estimated etching depth value calculated in step 4 this time is plotted as a plotted point 45. The estimated etching depth value that is held is transmitted to the cycle continuation determination unit 26 and the estimated next-cycle etching depth value calculation unit 27.

Next, in step 5, the estimated etching depth value is compared with an etching depth target lower limit value. The cycle continuation determination unit 26 compares the estimated etching depth value transmitted from the estimated etching depth value holding unit 25 with the etching depth target lower limit value stored in the etching depth target value database 30. In the case where the estimated etching depth value is equal to or greater than the etching depth target lower limit value, the etching cycle is finished. In the case where the estimated etching depth value is smaller than the etching depth target lower limit value, the etching cycle is continued. In the first etching cycle, the estimated etching depth value 45 is smaller than the etching depth target lower limit value 43 as illustrated in part (a-4) of FIG. 4. Thus, an etching cycle continuation signal is transmitted to the control unit 15, and the etching cycle is continued.

Next, in step 6, the etching depth of the next cycle is estimated, and the estimated etching depth is compared with an etching depth target value. The estimated next-cycle etching depth value calculation unit 27 estimates the etching depth of the next cycle by applying a linear approximation expression or a logarithmic approximation expression to plural estimated etching depth values transmitted from the estimated etching depth value holding unit 25. In the first etching cycle, as illustrated in part (a-4) of FIG. 4, linear approximation is performed by using two points of the estimated etching depth values 44 and 45, and an estimated etching depth value 46 of the case where the second etching cycle is performed is calculated. The estimated next-cycle etching depth value calculation unit 27 transmits the estimated etching depth value 46 of the next cycle to the next-cycle etching time calculation unit 28.

The next-cycle etching time calculation unit 28 compares the estimated etching depth value of the next cycle transmitted from the estimated next-cycle etching depth value calculation unit 27 with the etching depth target value stored in the etching depth target value database 30. In the case where the estimated etching depth value of the next cycle is greater than the etching depth target value, etching time of the next cycle is changed. In the case where the estimated etching depth value of the next cycle is equal to or smaller than the etching depth target value, the etching processing is performed in a predetermined etching time. In the first etching cycle, as illustrated in part (a-4) of FIG. 4, the estimated etching depth value 46 of the next cycle is smaller than an etching depth target value 42. Thus, the etching time is not changed, and a predetermined etching time is transmitted to the control unit 15.

The first etching cycle is finished in the way described above, and then the second etching cycle is started. The process flow of the second etching cycle will be described below with reference to the flowchart illustrated in FIG. 3 and part (b) of FIG. 4.

After the first etching cycle is finished, etching processing of the etching target film 72 and attached matter removal processing of the attached matter 73 are performed in step 1 and step 2 in a similar manner to the first etching cycle, and the results thereof are as illustrated in parts (b-1) and (b-2) of FIG. 4. Next, in step 3, the emission intensity area 53 is calculated in a similar manner to the first etching cycle. The emission intensity area integration unit 22 integrates the emission intensity area 53 (part (b-3) of FIG. 4) calculated by the emission intensity area calculation unit 21 in this cycle and the integrated value of emission intensity area (part (a-3) of FIG. 4) held by the emission intensity area holding unit 23 in the first etching cycle, and calculates a new integrated value of emission intensity area. The integrated value of emission intensity area that has been calculated is transmitted to the emission intensity area holding unit 23 and the estimated etching depth value calculation unit 24.

Next, in step 4, the estimated etching depth value is calculated in a similar manner to the first etching cycle, and the estimated etching depth value that has been calculated is transmitted to the estimated etching depth value holding unit 25. Next, in step 5, the estimated etching depth value is compared with an etching depth target lower limit value in a similar manner to the first etching cycle. In the second etching cycle, the estimated etching depth value 47 is smaller than the etching depth target lower limit value 43 as illustrated in part (b-4) of FIG. 4. Thus, an etching cycle continuation signal is transmitted to the control unit 15, and the etching cycle is continued.

Next, in step 6, the etching depth of the next cycle is estimated, and the estimated etching depth is compared with an etching depth target value in a similar manner to the first etching cycle. In the second etching cycle, as illustrated in part (b-4) of FIG. 4, a function (primary function or logarithmic function) is generated by performing approximation by using three points of the estimated etching depth values 44, 45, and 47, and an estimated etching depth value 48 of the case where the third etching cycle is performed is calculated. The estimated next-cycle etching depth value calculation unit 27 transmits the estimated etching depth value 48 of the next cycle to the next-cycle etching time calculation unit 28.

Next, in step 7, etching time for the next etching cycle is calculated. The next-cycle etching time calculation unit 28 calculates the etching time of the next cycle in a similar manner to the first etching cycle. In the second etching cycle, as illustrated in part (b-4) of FIG. 4, the estimated etching depth value 48 of the next cycle is larger than the etching depth target value 42. Thus, the etching time is changed. An etching time T2 after the change is calculated by using the following equation 1, and the changed etching time T2 is transmitted to the control unit 15. In equation 1, T1 represents the etching time before the change, D1 represents the estimated etching depth value at the end of this etching cycle, D2 represents an etching depth value predicted for the end of the next etching cycle, and Dt represents the etching depth target value.

$$T2 = T1 \times (Dt-D1)/(D2-D1) \quad \text{(equation 1)}$$

The second etching cycle is finished in the way described above, and then the third etching cycle is started. The process flow of the third etching cycle will be described below with reference to the flowchart illustrated in FIG. 3 and part (c) of FIG. 4.

After the second etching cycle is finished, in step 1, etching processing is performed by using the changed etching time, and the result thereof is as illustrated in part (c-1) of FIG. 4. Next, in steps 2 to 5, attached matter removal, calculation of emission intensity area, and calculation of estimated etching depth value are performed in a similar manner to the second etching cycle. In the third etching cycle, the estimated etching depth value 49 is greater than the etching depth target lower limit value 43 as illustrated in part (c-4) of FIG. 4. Thus, an etching cycle stopping signal is transmitted to the control unit 15, and the etching cycle is finished.

According to the operation described above, the variation of etching depth achieved as a result of the etching processing is reduced, and the stability or the reproductivity of the etching processing can be improved. The reason why the variation of etching depth can be reduced according to the exemplary embodiment can be considered as below.

Figure 5A:
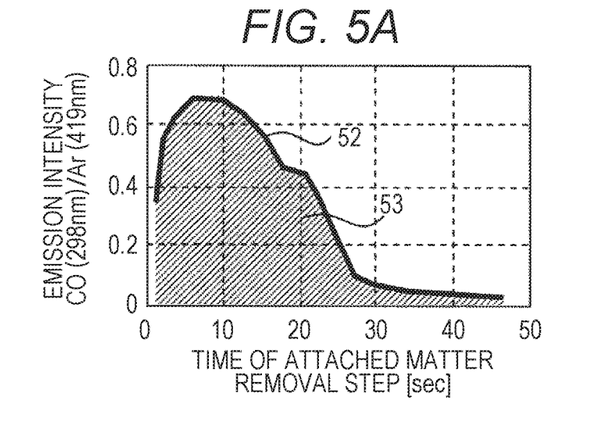
FIGS. 5A to 5C are diagrams illustrating relationships between an emission intensity obtained when a wafer illustrated in FIGS. 7A and 7B is processed and time of an attached matter removal step.
Figure 5B:
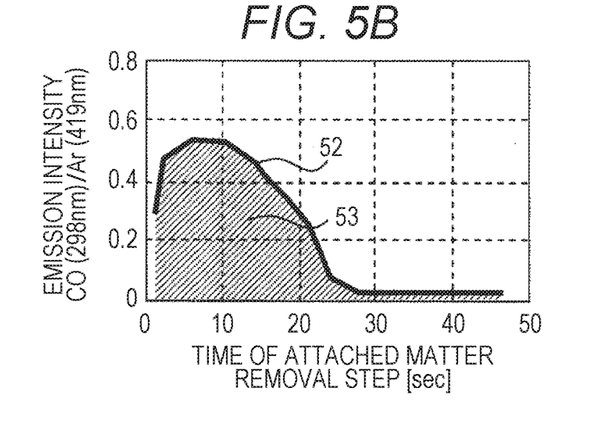
Figure 5C:
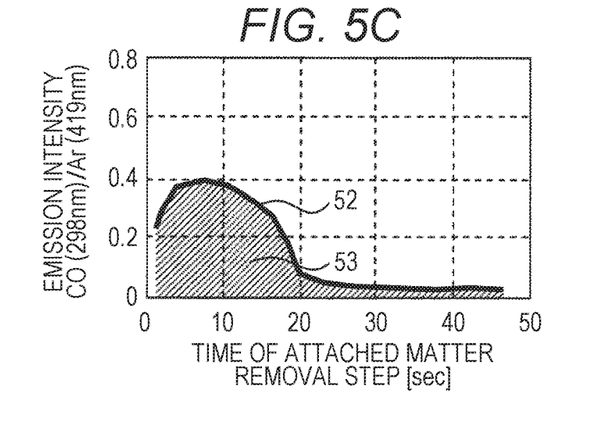

FIGS. 5A to 5C are schematic diagrams illustrating the relationship between emission intensity obtained when the plasma etching apparatus 1 illustrated in FIG. 1 processes the wafer illustrated in FIGS. 7A and 7B and the time of the attached matter removal step. FIGS. 5A to 5C are graphs illustrating the change of the emission intensity (ratio of CO (298 nm) to Ar (419 nm)) detected by the light receiver 13 in an etching step of removing the attached matter 73. The emission intensity is detected for wavelengths suitable for showing the removal of the attached matter 73 mainly attached to the inner wall of the processing chamber 2.

The attached matter 73 that is carbon-based reacts with an oxygen-based gas to generate carbon monoxide (CO) and carbon dioxide ($CO_2$), and thus the attached matter 73 is removed. Therefore, in the case where a large amount of the carbon-based attached matter 73 is removed, the emission intensity trend 52 indicates a large intensity as illustrated in FIG. 5A, or it takes a long time for the emission intensity to be reduced. Meanwhile, in the case where the amount of the carbon-based attached matter 73 that is removed is small, the emission intensity trend 52 indicates a small intensity as illustrated in FIG. 5C, or it takes a short time for the emission intensity to be reduced.

In addition, in the case where a large amount of the attached matter 73 is attached to the inner wall of the processing chamber 2 as in the state of FIG. 5A, the amount of the attached matter 73 attached to the wafer 6 becomes smaller, and, as a result, the etching depth of the etching target film 72 becomes deeper. Meanwhile, in the case where the amount of the attached matter 73 attached to the inner wall of the processing chamber 2 is small as in the state of FIG. 5C, the amount of the attached matter 73 attached to the wafer 6 becomes larger, and, as a result, the groove formed in the etching target film 72 becomes shallower. FIG. 5B illustrates a state in between of the FIGS. 5A and 5C.

FIG. 6 is a graph illustrating the correlation between the etching depth of the etching target film 72 and the emission intensity area 53 calculated from the ratio of the emission intensity of CO (298 nm) to the emission intensity of Ar (419 nm). As illustrated in FIG. 6, the etching depth of the etching target film 72 and the emission intensity area 53 have a positive correlation, and this enables estimating the etching depth of the etching target film 72 by using the emission intensity area 53. Since the etching depth of the etching target film 72 can be estimated by using the emission intensity area 53, the variation of etching depth can be reduced.

In the description of the exemplary embodiment, it has been explained that the "etching depth of the etching target film 72" can be estimated by using the relationship between the "etching depth of the etching target film 72" and the "emission intensity area" as illustrated in FIG. 6. The "etching depth of the etching target film 72" may be a value indicating the amount of etching of the etching target film 72, such as an etching rate or an etching dimension of the etching target film 72.

Further, although the number of etching cycles is determined on the basis of the estimated etching depth of the etching target film 72 in the exemplary embodiment, the estimated etching depth of the etching target film 72 may be reflected on or used for correcting the plasma etching condition of the next wafer as control (advanced process control: APC) of suppressing the variation of plasma processing by feedback control or feedforward control.

What is claimed is:

1. A plasma processing apparatus comprising:
a processing chamber in which etching target film is etched by using plasma;
a radio frequency power source that supplies radio frequency electric power for generating the plasma;
a monitoring unit that monitors light emission of the plasma; and
a calculation unit that estimates an etching amount of plasma etching of the etching target film based on an emission intensity and a correlation between the etching amount of the etching target film and the emission intensity, the emission intensity being obtained when removing, by using the plasma, a deposition film deposited as a result of the plasma etching, the correlation being obtained in advance, wherein
the emission intensity is obtained by dividing a first emission intensity by a second emission intensity, and
the first emission intensity is different from the second emission intensity.

2. A plasma processing apparatus comprising:
a processing chamber in which etching target film is etched by using plasma;
a radio frequency power source that supplies radio frequency electric power for generating the plasma;
a monitoring unit that monitors light emission of the plasma;
a calculation unit that estimates an etching amount of plasma etching of the etching target film based on an emission intensity and a correlation between the etching amount of the etching target film and the emission intensity, the plasma etching being performed by repeating an etching step, the emission intensity being obtained when removing, by using the plasma, a deposition film deposited as a result of the plasma etching, the correlation being obtained in advance; and
a control unit that finishes the plasma etching based on the estimated etching amount, wherein
the emission intensity is obtained by dividing a first emission intensity by a second emission intensity, and
the first emission intensity is different from the second emission intensity.

3. The plasma processing apparatus according to claim 1, wherein
the first emission intensity is an emission intensity of carbon monoxide and the second emission intensity is an emission intensity of argon.

4. A plasma processing method of etching an etching target film by using plasma, the plasma processing method comprising:
monitoring an emission intensity when removing, by using the plasma, a deposition film deposited as a result of plasma etching of the etching target film; and
estimating an etching amount of the plasma etching based on the monitored emission intensity and a correlation between the etching amount of the etching target film and the emission intensity, the correlation being obtained in advance, wherein
the emission intensity is obtained by dividing a first emission intensity by a second emission intensity, and
the first emission intensity is different from the second emission intensity.

5. The plasma processing method according to claim 4, further comprising
finishing the plasma etching based on the estimated etching amount,
wherein the plasma etching is performed by repeating an etching step.

6. The plasma processing method according to claim 4, wherein
the first emission intensity is an emission intensity of carbon monoxide and the second emission intensity is an emission intensity of argon.

7. The plasma processing apparatus according to claim 3, wherein the deposition film is deposited due to plasma using a fluorocarbon gas.

* * * * *